United States Patent [19]

Shiga

[11] 3,811,075

[45] May 14, 1974

[54] MAGNETO-SENSITIVE DEVICE HAVING PN JUNCTION

[75] Inventor: Kazumasa Shiga, Osaka, Japan

[73] Assignee: Matsushita Electric Industrial Company Limited, Osaka, Japan

[22] Filed: May 23, 1972

[21] Appl. No.: 256,157

[30] Foreign Application Priority Data

May 26, 1971 Japan ............................... 46-36526

[52] U.S. Cl. ......... 317/235 H, 307/309, 317/235 E, 317/235 AE, 317/235 AM, 317/235 AN, 317/235 R

[51] Int. Cl. .......................... H01l 5/00, H01l 19/00

[58] Field of Search .................. 317/235 H, 235 AE

[56] References Cited

UNITED STATES PATENTS

| | | | |
|---|---|---|---|
| 3,416,049 | 12/1968 | Bohn et al. | 317/235 F |
| 3,522,494 | 8/1970 | Bosch | 317/235 H |
| 3,596,114 | 7/1971 | Maupin et al. | 317/235 H |
| 3,668,439 | 6/1972 | Fujikawa et al. | 317/235 H |
| 3,533,159 | 10/1970 | Hudson | 317/235 H |

OTHER PUBLICATIONS

Collins, "MOS Hall Device", IBM Tech. Discl. Bull., Vol. 12, No. 12, May 1970, page 2166.

*Primary Examiner*—Rudolph V. Rolinec
*Assistant Examiner*—William D. Larkins

[57] ABSTRACT

A two terminal positive feedback magnetic sensitive semi-conductor device having P-type regions and N-type regions in which a channel is formed between PN junctions. The width of the channel is controlled by Lorenz's force in response to the strength of the magnetic field and as a result an input current passing through the channel is controlled.

4 Claims, 17 Drawing Figures

Fig. 1A
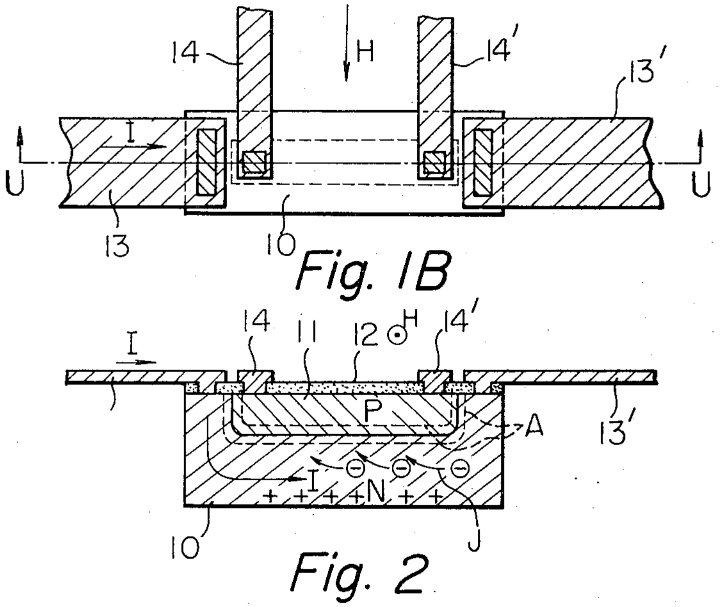
Fig. 1A, Fig. 1B
Fig. 2
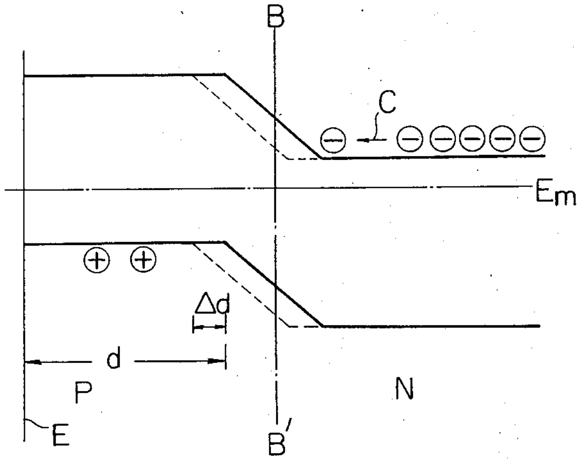

MAGNETO-SENSITIVE DEVICE HAVING PN JUNCTION

The present invention relates to semiconductive devices and more particularly to a semiconductive magneto-sensitive device having a PN junction.

A typical magneto-sensitive device is either a Hall effect device or a magneto resistive device which usually includes a semiconductive body made of either InSb or InAs in which free charge carriers have such high mobilities as to cause high magneto-snsitivity of the device. The semiconductive body should be shaped so thin as to reduce the electric power consumption in the device and to increase the sensitivity of the device. Difficulty is encountered in fabricating such thin body of InSb or InAs because of brittleness of these materials. Furthermore, it is difficult to make such thin region with a uniform concentration in a semiconductor body through a diffusion process.

On the other hand, silicon substrate contains free charge carriers having poor mobility and can hardly have the intrinsic material characteristics which contributes to the Hall effect or magneto resistance effect. Accordingly, it is difficult to incorporate the conventional Hall effect device and magneto-resistive device in a silicon wafer wherein various elements can be formed through known IC techniques.

It is therefore an object of the invention to provide an improved magneto-sensitive device which can be formed in a silicon wafer through a well known technique.

It is another object to provide a magneto-sensitive device having an extremely high sensitivity.

It is a still further object to provide a magneto-sensitive device which has a low internal impedance.

Other objects, features and advantages of the invention will become apparent from a perusal of the following detailed description of specific illustrative embodiments thereof as illustrated in the accompanying drawings, and from the appended claims.

In the accompanying drawings:

FIG. 1A is a plan view of a simplified device for the sake of explanation of a principle on which the invention is based;

FIG. 1B is a sectional view taken along the line U-U shown in FIG. 1;

FIG. 2 is a diagrammatic view illustrating an energy band structure in the vicinity of a PN junction;

Figure 3A:
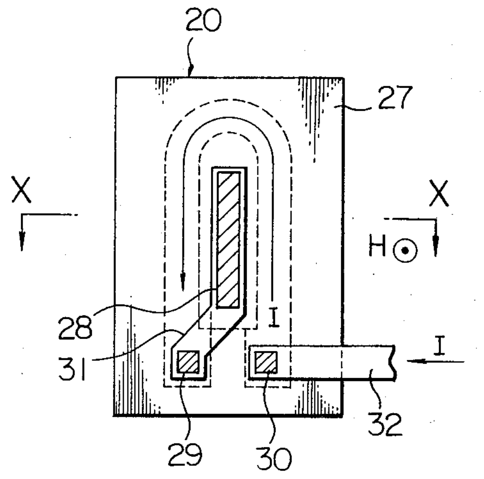
FIG. 3A is a plan view of a preferred embodiment of the invention.

Referring now to the drawings and more specifically to FIGS. 1A and 1B, there is shown a simplified device which comprises a monocrystalline body of semiconductor, e.g., silicon or any other semiconductor. The semiconductive body includes a region 10 of N conductivity type, and a region 11 of P conductivity type, the region 11 being inserted into the region 10 as illustrated. An insulating layer 12 of, for example, silicon dioxide covers the entire top surface of the semiconductive body, the insulating layer 12 having four apertures formed in portions corresponding to the utmost end portions of the regions 10 and 11. Two pair of electrodes 13 and 13', and 14 and 14' are formed on the insulating layer 12, which are in ohmic contact with the regions 10 and 11 through the four apertures, resepctively. It is now to be understood that a PN junction is formed between the regions 10 and 11, the PN junction causing a depletion layer having an extent as indicated by broken line A.

FIG. 2 illustrates an energy band structure near the junction between the P and N type regions 11 and 10 of the device of FIGS. 1A and 1B. The metallurgical boundary between the regions 10 and 11 is indicated by a line B—B'. As indicated by a dot and dash line Em, the Fermi levels in both the regions 10 and 11 are equalized due to the diffusion of the majority carriers in the regions 10 and 11. Therefore, a transition layer or depletion layer is formed around the boundary B—B'.

When, in this instance, a certain number of electrons in the conduction band of the N region is forced to approach to the depletion layer by an external force such as magnetic force as shown by an arrow C, the depletion region around the boundary B—B' shifts to the left of the figure. As a result the depth $d$ of the valence band from the surface of the body indicated by E reduces to $d$-$\Delta d$, leading to decrease of the conductance of the P region.

Referring back to FIGS. 1A and 1B, a d-c voltage is impressed across the electrodes 13 and 13' so as to produce a flow of current I through the N region 10. When, in this instance, a magnetic field directed as indicated by an arrow H is established in the N region, electrons carrying the current I are forced to move through Lorentz's force caused by the magnetic field toward the PN junction as indicated by arrows J, so that, the depletion layer extending in the P region 11 is shifted thereby to cause to decrease the conductance of the P region. The increase of the conductance of the P region can be detected by applying a d-c voltage through the electrodes 14 and 14'. It should be now understood that the conductance of the P region is varied according to the variation of the intensity of the magnetic field H or current I.

Figure 3B:
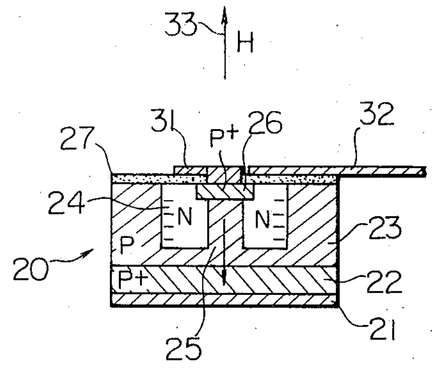
FIG. 3B is a sectional view taken along the line X—X shown in FIG. 3A.

In FIGS. 3A and 3B, a preferred embodiment according to the above stated principle of the invention is shown, which comprises a monocrystalline body 20 made of a semiconductor, e.g., silicon or any other semiconductor. A metallic plate electrode 21 is formed on one entire surface of the body 20. The body 20 includes a $P^+$ region 22 adjacent to the electrode 21, a P region 23 adjacent to the $P^+$ region 22, and an N region 24 which is U-shaped to surround a channel portion 25 of the P region 23. The body 20 further includes a $P^+$ region 26 adjacent to the channel portion 25 of the P region 23 and to the other surface of the body. The other surface of the body 20 is covered by a insulating layer 27 which has three apertures 28, 29 and 30. An electrode 31 ohmically contacted through the aperture 28 to the $P^+$ region 26 and through the aperture 29 to one end of the N region 24. An electrode 32 is ohmically connected through the aperture 30 to the other end of the N region 24. It is now to be noted that a depletion layer is formed near the boundary between the P and N regions 23 and 24.

In operation, a d-c voltage is exerted across the electrodes 21 and 32 so as to produce a flow of current I through the N region 24, $P^+$ region 26, the channel portion 25 and the $P^+$ region 22. When, in this instance, a magnetic field H directed as indicated by an arrow 33 is applied to the device, the electrons carrying the current I in the N region 24 are forced to depart from the PN junction as illustrated, so that, the channel portion 25 is widened thereby causing to increase the conductance of the channel portion 25. The current I, therefore, increases to thereby cause an increase of the numbers of the electrons departed from the PN junction, resulting in further increase of the conductance of the channel portion 25. It should be appreciated that variation of the magnetic field H is converted into amplified variation of the current I because the variation of the conductance of the channel portion is positively fed back to the variation of the current I. The device of FIGS. 3A and 3B therefore has an extremely high magneto-sensitivity.

Figure 4:
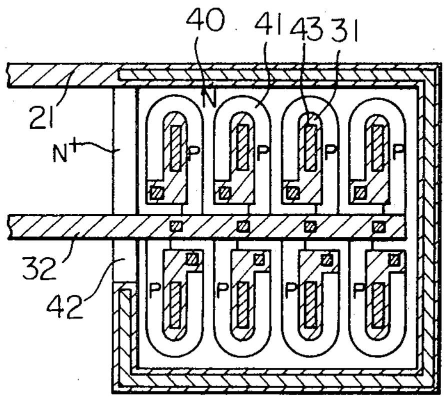
FIGS. 4 and 5 are plan views of other embodiments of the invention.

FIG. 4 illustrates another device according to the invention, which comprises an N type silicon wafer 40 having, for example, a resistivity of 40Ω-cm and an area of $290\mu \times 290\mu$. The entire upper surface of the wafer 40 is covered by an insulator which is, in this case, assumed to be transparent for the simplicity of explanation and therefore is not indicated by any numerals. A plurality of U-shaped P type islands 41 are formed in the wafer 40 through a known IC technique. Each of the P type islands has, for example, a surface concentration of $10^{17}$ $cm^{-3}$ and a depth of $1.5\mu$. A rectangular $N^+$ region 42 is formed at the edges of the wafer 40, which has a surface concentration of $10^{20}$ $cm^{-3}$ and diffusion depth of $0.5\mu$. A plurality of L-shaped electrodes 31 are ohmically contacted through apertures formed in the insulator (not shown) to $N^+$ regions 43 adjacent to the channel portions surrounded by the P type regions 41 and to end of the P type regions 41. The other ends of the P type islands 41 are ohmically connected to an electrode 32 through apertures formed in the insulator. A Greek fret shaped electrode 21 is ohmically connected to the $N^+$ region 42. Being arranged as above, the device of the figure includes a plurality of devices as shown FIGS. 3A and 3B which are connected to the electrodes 21 and 32 in parallel with one another.

Figure 5:
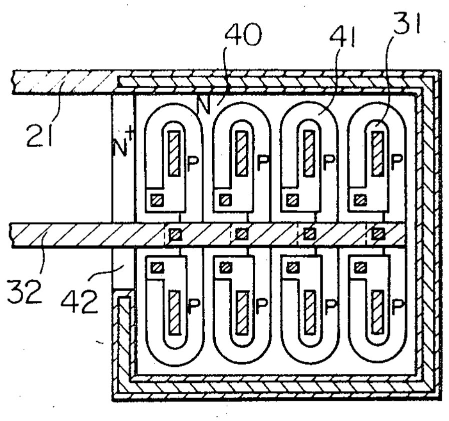

FIG. 5 illustrates further another device which has identically the same construction as the device of FIG. 4 except that of the P type islands of one side are patterned inversely.

Figure 6:
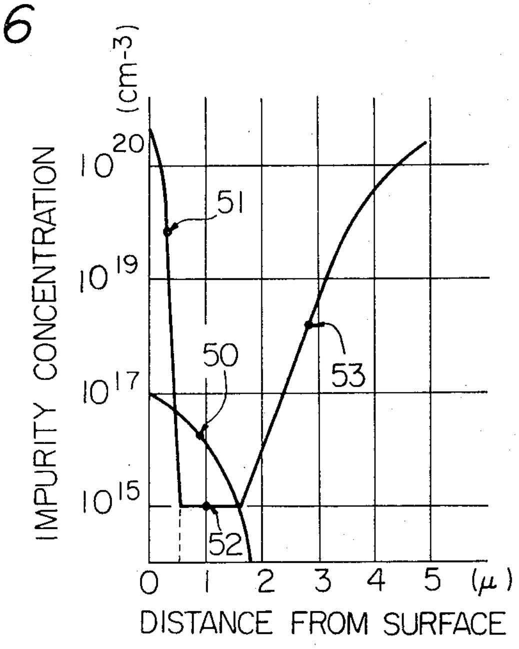
FIG. 6 is a diagram showing impurity concentrations in the epitaxial layer of a device of FIG. 4 or 5.

FIG. 6 illustrates impurity ocncentrations in the wafer 40 of FIGS. 4 and 5. A curve 50 represents the impurity concentration of each U-shaped P type region. Curves 51, 52 and 53 represent respectively impurity concentrations of the $N^+$ region 42, the N type wafer 40 and the $N^+$ region 43.

Figure 7:
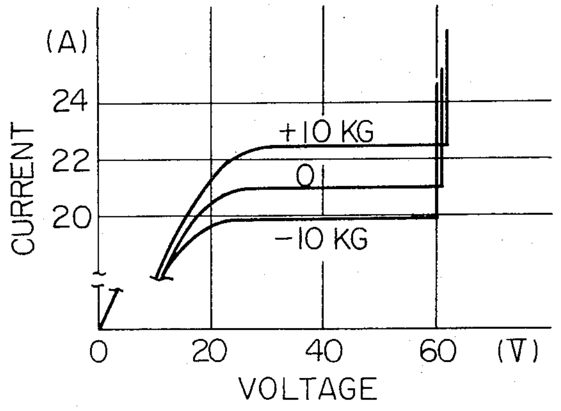
FIG. 7 is a graph showing V-I characteristics of the device of FIG. 4 in terms of magnetic field applied to the device.

FIG. 7 shows V-I characteristics of the device of FIG. 4 in terms of intensity of the magnetic field applied to the device, when positive and negative terminals of a d-c source are connected to the electrodes 21 and 32, respectively.

Figure 8:
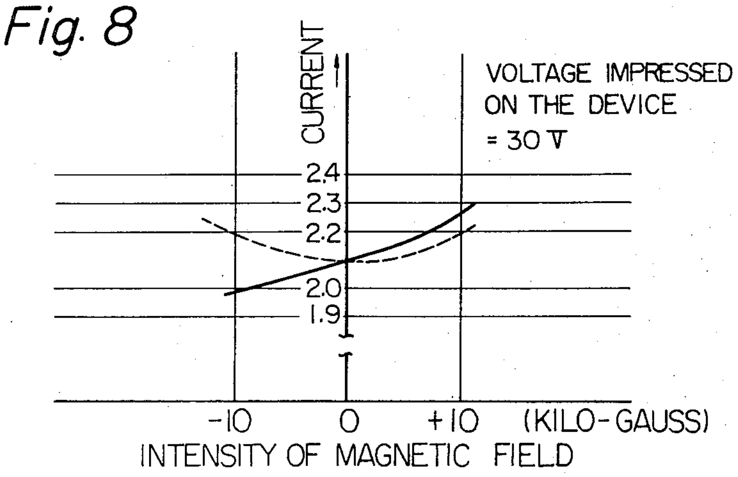
FIG. 8 is a graph showing relationships between the intensity of a magnetic field applied to the devices of FIGS. 4 and 5 to the magnitude of a current flowing through the devices when a voltage of 30 volts is applied to the devices.

In FIG. 8, characteristics of the device of FIGS. 4 and 5 are shown by solid and broken curves, respectively.

Figures 9A, 9B:
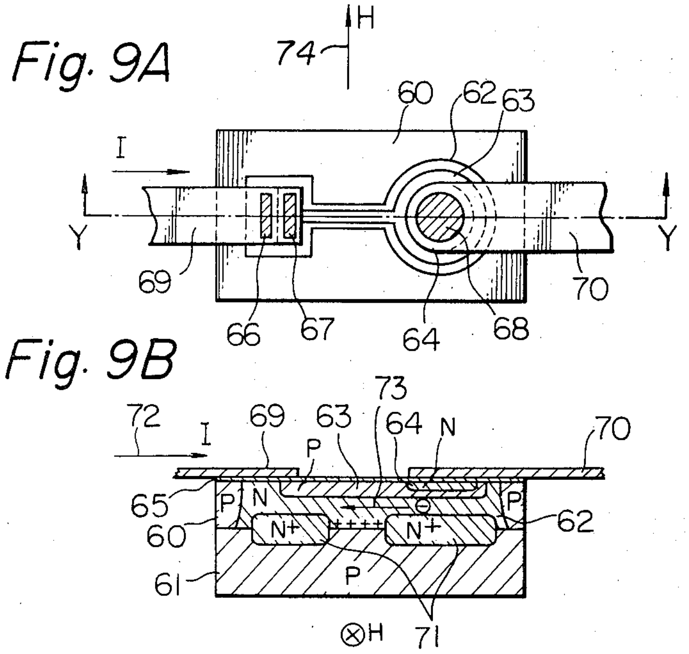
FIG. 9A is a plan view showing further embodiment of the invention.
FIG. 9B is a sectional view taken along the line Y—Y in FIG. 9A.

In FIGS. 9A and 9B, still further device according to the invention is shown which has a construction similar to a planar type transistor. This device includes a body containing a P type layer 60 formed on a P type substrate 61, an N type current flowing region 62 surrounded by the layer 60, a P type region 63 inset into the region 62, and an $N^+$ type region 64 inset into the region 63. The entire upper surface of the body is covered by an insulating layer 65 having three apertures 66, 67 and 68. The insulating layer 65 is, in this case, assumed to be transparent for the sake of illustration. It is preferable that the N type region 62 has a relatively small resistivity and the P type region 63 has, on the contrary, a relatively large resistivity. An electrode 69 is ohmically connected through the aperture 66 to the N type region 62 and through the aperture 67 to the P type region 63. Another electrode 70 is ohmically connected through the aperture 68 to the $N^+$ type region 64. The $N^+$ regions 71 are formed between the substrate 61 and the layer 62 so as to reduce the resistivity of the layer 62 through which a operation current flows. It is now to be understood that a PN junction is formed around the boundary of the region 62 and the region 63. As illustrated, the regions 62, 63 and 64 correspond to the collector, base and emitter of a planar type transistor.

In operation, a d-c voltage is impressed across the electrodes 69 and 70 so as to cause a flow of current I as indicated by an arrow 72 thereby causing electrons moves in the region 62 as indicated by an arrow 73. When, in this instance, a magnetic field H directed as indicated by a mark 74 is applied to the device, the electrons are forced to approach to the PN junction formed around the boundary between the regions 62 and 63 with the result that the conductance of the region 63 increases according to the intensity of the magnetic field H. Since a PN junction between the regions 63 and 64 is forwardly biased by the voltage exerted across the electrodes 69 and 70, the increase of the conductivity of the region 63 results in increase of a current across the PN junction between the regions 63 and 64, whereby the current I flowing through the region 62 increases in an amplified extent. It will be apparent from the above description that the current I through 62 largely varies in dependence of the variation of the magnetic field applied to the device.

The device of FIGS. 9A and 9B is readily fabricated by the following steps of: preparing a P type substrate having a thickness of $250\mu$ and a resistivity of 20Ω-cm, growing an N type epitaxial layer having a thickness of $5\mu$ and a resistivity of $4\Omega$-cm, diffusing a P type impurity to form a P type region in the epitaxial layer while remaining a portion of the epitaxial layer, diffusing a P type impurity into the remaining portion to form a P type region of a thickness of $1.0\mu$, diffusing an $N^+$ type impurity into the P type region to form an N type region of a thickness $0.5\mu$, forming an insulating layer of silicon oxide or silicon nitride of a thickness of $0.4\mu$ on the epitaxial layers including the regions formed therein as above stated through a process of thermal oxidization, vacuum evaporation or spattering, and electrodes made of aluminium having a thickness of $2\mu$ through spattering or other process. A device fabricated through the above stated process has a sensitivity of $1\mu$A/Gauss under a d-c voltage of 10V.

The above stated devices can be formed in an N type epitaxial wafer, providing the following features:

a. The Hall effect region has a preferably uniform impurity concentration since the epitaxial layer has impurity concentration more uniform than that of the impurity diffused layer.

b. The channel region formed in the epitaxial layer contains charge carriers having a reduced mobility since the channel region has an impurity concentration much larger than that of the epitaxial layer.

c. Since the N type epitaxial layer contains charge carriers having mobility much larger than that of the P type layer, the Hall effect region formed in the epitaxial layer is preferably operable.

Figure 10:
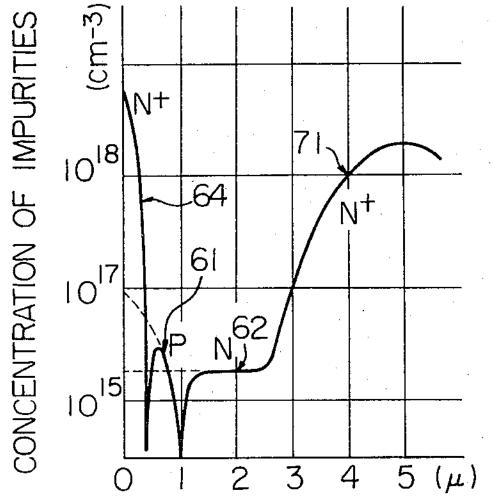
FIG. 10 is a graph showing impurity concentrations in an epitaxial layer of the device of FIGS. 9A and 9B.

FIG. 10 shows a graph showing impurity concentrations in the device of FIGS. 9A and 9B, in which th impurity concentrations of the regions are represented by curves correspondingly designated.

Figure 11A:
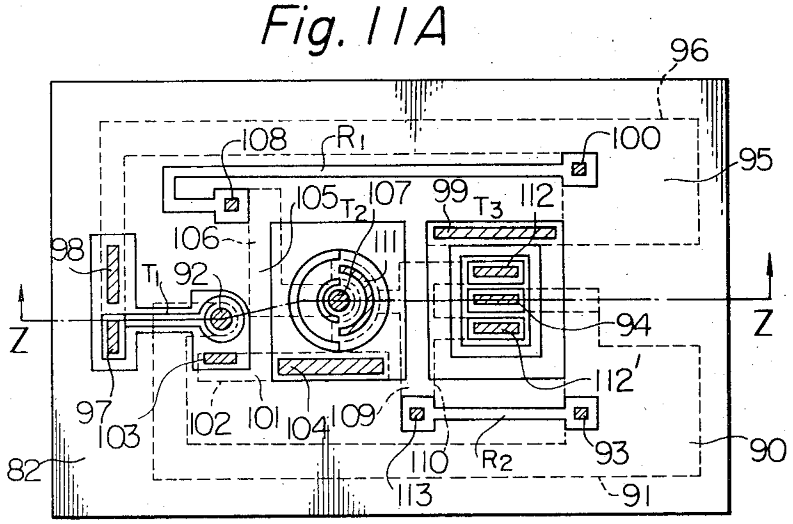
FIG. 11A is a plan view showing a still further embodiment of the invention.
Figure 11B:
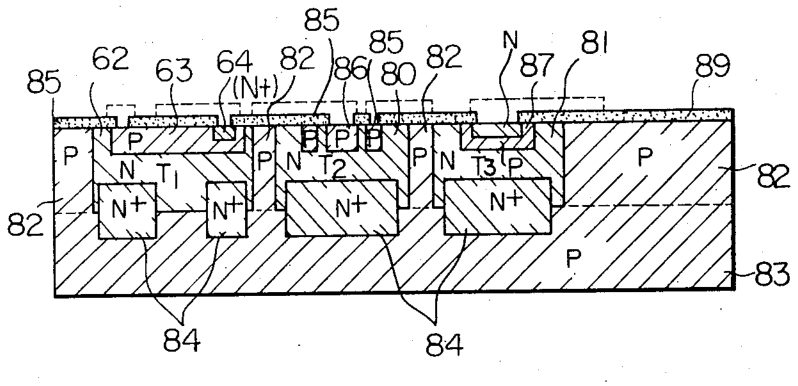
FIG. 11B is a sectional view taken along the line Z—Z in FIG. 11A.

In FIGS. 11A and 11B, further another device according to the invention is shown, which includes three N type islands 62, 80 and 81 formed in a P type region 82. The three islands are formed by first preparing a P type substrate 83, forming a plurality of $N^+$ layers 84 on the substrate 83, epitaxially growing an N type layer on the substrate 83 and the layers 84, and diffusing a P type impurity into the epitaxial layer to form the region 82 while remaining the islands 62, 80 and 81. A magneto-sensitive device $T_1$ of the type shown in FIGS. 9A and 9B, a PNP type transistor $T_2$ and an NPN type transistor $T_3$ are formed in the islands 62, 80 and 81. The device $T_1$ includes the same regions 62, 63 and 64 as the device of FIGS. 9A and 9B. The transistor $T_2$ includes the N region 80 acting as a base, an annular P region 85 acting as a collector, and a circular P region 86 acting as an emitter. The annular P region 85 has, for example, a thickness of about 1 micron and inner and outer diameters about 30 and 70 microns. The circular P region 86 has the same thickness as the annular P region 85 and a diameter 20 microns. The transistor $T_3$ includes the N region 81 acting as a collector, a P region 87 acting as a base, and an N region 88 acting as an emitter. The P region 87 has, for example, a thickness of about 1 micron, and an area of 60 × 105 microns. The N region 88 has, for example, a thickness of about 0.5 microns, and an area of 50 × 50 microns. The upper entire surface is covered by an insulating layer 89 made of, for example, silicon oxide and having a thickness of about 0.5 microns. A resistive regions $R_1$ and $R_2$ are formed in the P region 82. The resistive regions $R_1$ and $R_2$ have, for example, a thickness of 0.5 microns, a width 10 microns, and effective length 450 and 115 microns. The regions $R_1$ and $R_2$ can be formed at the same time when the region 88 of the transistor $T_3$ is formed. The insulating layer 89 is, in this case, assumed to be transparent for the simplicity of illustration, and has a plurality of apertures as indicated by hatchings. A conductor 90 as indicated by a closed broken line 91 is formed on the insulating layer 89, which is ohmically connected through apertures 92, 93 and 94 to the $N^+$ region 64, one end of the resistive layer $R_2$ and the N region 88. A conductor 95 indicated by a closed broken line 96 is ohmically connected through apertures 97, 98, 99 and 100 to the regions 63, 62, 81 and one end of the resistive regions $R_1$. A conductor 101 indicated by a closed broken line 102 is ohmically connected through apertures 104 to regions 62 and 80. A conductor 105 indicated by a closed broken line 106 is ohmically connected through apertures 107 and 108 to the region 86 and the other end of the resistive region $R_1$. A conductor 109 indicated by a broken line 110 is ohmically connected through apertures 111, 112 and 112′, and 113 to the regions 85 and 87, and the other end of the resistive region $R_2$. Rightward end portions of the conductors 90 and 95 have, for example, areas 120 × 120 microns for the sake of connection of external leads thereto. The conductor may be aluminium formed by evaporation and photoetching process. It is to be noted that portions under the apertures formed in the insulating layer may be heavily doped to provide desirable ohmic contacts, if desired.

Figure 12:
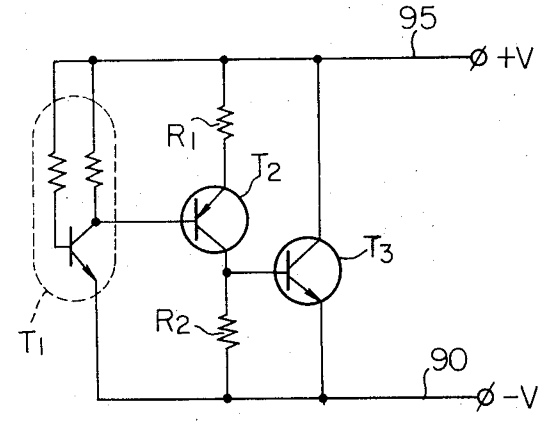
FIG. 12 is a diagram showing an equivalent circuit of the device of FIGS. 11A and 11B.

FIG. 12 illustrates an equivalent circuit of the device of FIGS. 11A and 11B, which comprises the magneto-sensitive device $T_1$ having base and collector connected to a line 95 and an emitter connected to a line 90. The transistor $T_2$ has a base connected to the collector of the device $T_1$, and an emitter connected through a resistor $R_1$ to the line 95 and a collector connected through a resistor $R_2$ to the line 90. The transistor $T_3$ has a base connected to the collector of the transistor $T_2$, an emitter connected to the line 90, and a collector connected to the line 95.

In operation, positive and negative voltages +V and −V are applied to the lines 95 and 90. The variation of the collector current of the device $T_1$ is amplified by the transistors $T_2$ and $T_3$, causing to raise the sensitivity of the particular device. The device shown in FIGS. 11A and 11B can be readily fabricated through a well-known technique, such as, planar diffusion and epitaxial growth.

Figure 13:
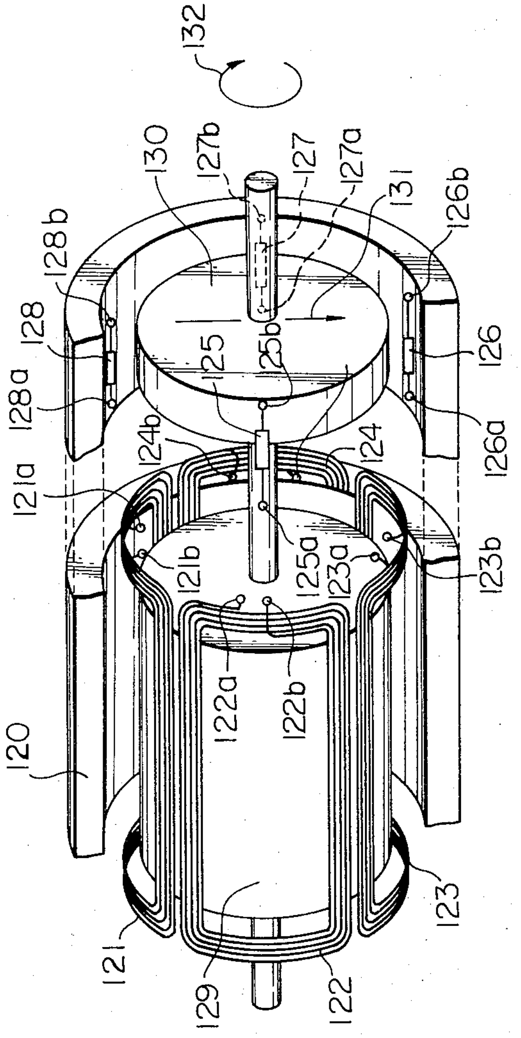
FIG. 13 is a schematic view of a d-c motor employing the device according to the invention.

FIG. 13 shows, a brushless d-c motor employing a magneto-sensitive device of the invention. The motor includes a cylindrical tubular stationary core 120 to the inner peripheral wall of which four coils 121, 122, 123 and 124 are secured. The coils 121, 122, 123 and 124 have terminals **121*a* and 121*b*, 122*a* and 122*b*, 123*a* and 123*b*, and 124*a* and 124*b*, respectively. Four magneto-sensitive devices 125, 126, 127 and 128 of the invention are secured on the inner peripheral wall of the core 120 at angular positions corresponding to the coils 121, 122, 123 and 124. The devices 125, 126, 127 and 128 have terminals 125*a* and 125*b*, 126*a* and 126*b*, 127*a* and 127*b*, and 128*a* and 128*b*, respectively. Cylindrical rotors 129 and 130 each having a magnetic polarity as indicated by an arrow 131 are mounted on a shaft rotatably fixed at the axis of the stationary core 120.**

When, in operation, a d-c voltage is exerted on the terminals of the devices 125, 126, 127 and 128 and the device 126 is assumed to be energized, a current signal flows through the device 126, the current signal being utilized for energizing the coil 122 which then forces the rotor 129 together with the rotor 130 to rotate through a quarter rotation. The device 125 is then energized to cause a current signal therethrough which is used for energizing the coil 121, whereby the rotor 129 together with 130 is rotated through a quarter rotation. The same operation as above are repeated so that the rotors 129 and 130 rotates as indicated by an arrow 132.

When, in this instance, the device shown in FIGS. 11A and 11B is used as the devices 125, 126, 127 and 128, either an amplifier or an electronic switch is unnecessary, viz., the terminals 121*a*, 122*a*, 123*a* and 124*a* of the coils are connected to the terminals 125*a*, 126*a*, 127*a* and 128*a* of the devices and a d-c voltage is impressed across the terminals 121*b* and 125*b*, 122*b* and 126*b*, 123*b* and 127*b*, and 124*b* and 128*b*. Various types of motor may be devised by using the magneto-sensitive device of the invention. It should be noted that the device of the invention can be incorporated with any other elements such as an inductor, capacitor, and furthermore with a suitable magnetic circuit for the purpose of magnetic induction.

It should be apparent from the above detailed description that an improved magneto-sensitive device has been provided. The described system has an extremely high sensitivity and can be readily fabricated by a well-known technique.

It will be understood that the invention is not to be limited to the exact construction shown and described and that various changes and modifications may be made without departing from the spirit of the invention, as defined in the appended claims.

What is claimed is:

1. A two terminal positive feedback magnetic sensitive semiconductor device wherein a magnetic field is applied perpendicularly to the element comprising: a first conductivity type substrate, a first conductivity type layer formed on said substrate, a substantially U-shaped second conductivity type layer diffused into said first conductivity type layer, an elongated first conductivity type layer surrounded by said U-shaped layer for passing a current passing through the semiconductor device, a first terminal electrode connected to one end of said U-shaped layer, a second terminal electrode provided on one side of said substrate, a center electrode provided on said elongated layer and connected to the other end of said U-shaped layer and passing the current through a portion of the first conductive type layer forming a channel surrounded by the U-shaped layer, said channel being formed between depletion layers of PN junctions, thereby controlling the width of the channel due to Lorenz's force in response to the strength of the magnetic field and controlling the input current passing through the channel.

2. A two terminal positive feedback magnetic sensitive semiconductor device according to claim 1, wherein a plurality of said devices are connected on a single substrate.

3. A two terminal positive feedback magnetic sensitive semiconductor device according to claim 1, wherein the first conductive type semiconductor is P-type and second conductive type is N-type, respectively.

4. A two terminal positive feedback magnetic sensitive semiconductor device according to claim 1, wherein the first conductive type semiconductor is N-type and second conductive type is P-type, respectively.

* * * * *